US009805151B1

(12) United States Patent
Wen et al.

(10) Patent No.: US 9,805,151 B1
(45) Date of Patent: Oct. 31, 2017

(54) METHOD AND APPARATUS FOR LAPLACE TRANSFORM SYSTEM SIMULATION

(71) Applicant: Cadence Design Systems, Inc., San Jose, CA (US)

(72) Inventors: Jimin Wen, Beijing (CN); Peng Wang, Beijing (CN)

(73) Assignee: Cadence Design Systems, Inc., San Jose, CA (US)

( * ) Notice: Subject to any disclaimer, the term of this patent is extended or adjusted under 35 U.S.C. 154(b) by 885 days.

(21) Appl. No.: 13/886,191

(22) Filed: May 2, 2013

Related U.S. Application Data

(60) Provisional application No. 61/763,448, filed on Feb. 11, 2013.

(51) Int. Cl.
G06F 17/50 (2006.01)

(52) U.S. Cl.
CPC ...... G06F 17/5045 (2013.01); G06F 17/5009 (2013.01)

(58) Field of Classification Search
None
See application file for complete search history.

(56) References Cited

U.S. PATENT DOCUMENTS

| | | | | |
|---|---|---|---|---|
| 6,047,117 A * | 4/2000 | Kahng | ...... | G06G 7/48 257/275 |
| 7,334,199 B1 * | 2/2008 | Russell, Jr. | ...... | G06F 17/5036 702/196 |
| 8,028,256 B1 * | 9/2011 | Russell, Jr. | ...... | G06F 17/5036 703/14 |
| 2013/0103369 A1 * | 4/2013 | Huynh | ...... | G06F 17/5018 703/2 |

OTHER PUBLICATIONS

Harrison, Jeffrey Norwood. "Dynamic range and bandwidth of analog CMOS circuits." PhD diss., Macquarie University, Sydney, Australia, 2002.*

"Unilateral Laplace Transform." Unilateral Laplace Transform—from Wolfram MathWorld. N.p., n.d. Web. Accessed on Jan. 19, 2017. <http://mathworld.wolfram.com/UnilateralLaplaceTransform.html>.

(Continued)

*Primary Examiner* — Aniss Chad
(74) *Attorney, Agent, or Firm* — Vista IP Law Group, LLP

(57) ABSTRACT

Disclosed are methods and apparatus for implementing system simulation. The method includes generating a high-order equation based on a transfer function that represents characteristics of at least one frequency-domain component in a circuit; converting the high-order equation into a state equation comprising a series of state variables, wherein the high-order equation and the state equation have corresponding coefficients for each order and state variable, and the coefficients of the state equation have a first dynamic range; and normalizing the coefficients for the state variables by adjusting each state variable with a corresponding factor to obtain a normalized state equation having normalized coefficients, wherein the normalized coefficients of the normalized state equation have a second dynamic range smaller than the first dynamic range. The method and apparatus improve accuracy of analyses for the system.

23 Claims, 8 Drawing Sheets

(56) References Cited

OTHER PUBLICATIONS

"Polynomial." Polynomial—from Wolfram MathWorld. N.p., n.d. Web. Accessed on Jan. 19, 2017. <http://mathworld.wolfram.com/Polynomial.html>.

"Fourier Transform." Fourier Transform—from Wolfram MathWorld. N.p., n.d. Web. Accessed on Jan. 19, 2017. <http://mathworld.wolfram.com/FourierTransform.html>.

"Laplace Transform." Laplace Transform—from Wolfram MathWorld. N.p., n.d. Web. Accessed on Jan. 19, 2017. <http://mathworld.wolfram.com/LaplaceTransform.html>.

"Discrete Fourier Transform." Discrete Fourier Transform—from Wolfram MathWorld. N.p., n.d. Web. Accessed on Jan. 19, 2017. <http://mathworld.wolfram.com/DiscreteFourierTransform.html>.

"Coefficient." Coefficient—from Wolfram MathWorld. N.p., n.d. Web. Accessed on Jan. 19, 2017. <http://mathworld.wolfram.com/Coefficient.html>.

"Bilateral Laplace Transform." Bilateral Laplace Transform—from Wolfram MathWorld. N.p., n.d. Web. Accessed on Jan. 19, 2017. <http://mathworld.wolfram.com/BilateralLaplaceTransform.html>.

"Fast Fourier Transform." Fast Fourier Transform—from Wolfram MathWorld. N.p., n.d. Web. Accessed on Jan. 19, 2017. <http://mathworld.wolfram.com/FastFourierTransform.html>.

\* cited by examiner

METHOD AND APPARATUS FOR LAPLACE TRANSFORM SYSTEM SIMULATION

CROSS REFERENCE TO RELATED APPLICATION

This application claims the benefit of U.S. provisional patent application Ser. No. 61/763,448, entitled "METHOD AND APPARATUS FOR LAPLACE TRANSFORM SYSTEM SIMULATION" and filed Feb. 11, 2013. The content of the aforementioned provisional application is hereby expressly incorporated by reference in its entirety for all purposes.

BACKGROUND

Technical Field

Various embodiments described herein generally relate to circuit simulation and, more particularly, to a Laplace transform system simulation method and apparatus.

Related Art

With the fast developments in semiconductor manufacturing and acute requirements for more advanced product functions, integrated circuits (ICs) have become too complex for engineers to design by specifying each individual transistor and wire. To facilitate circuit design, behavioral blocks, which enable designers to capture high-level behavioral descriptions of components of an IC in a set of mathematical terms, are widely used in a top-down mixed-signal simulator. For example, the behavioral blocks may be defined to describe the analog behavior of one or more components in an IC. During simulation, all analog blocks are evaluated by converting complex equations into simpler ones. The complex equation, which may take the form of a high-order Laplace transfer function, exhibits a set of component characteristics and/or behavior in an IC.

Laplace transform components are widely used in radio frequency (RF) design, including Laplace transform filters described in Verilog-A or VHDL-AMS (Very high speed integrated circuits Hardware Description Language-Analog-Mixed Signal) language, or s-domain sources in the CMI (Compiled Model Interface), like svcvs (s-domain voltage controlled voltage source) or sccvs (s-domain current controlled voltage source). As to behavioral blocks, designers only need to focus on component's characteristics and behavior, and need not pay attention to detailed information on internal structure of a circuit. However, as system order and frequency become higher, accumulation of dynamic range of a difference equation set becomes more severe, which leads to accuracy and convergence problems when applying numerical methods for simulation. The issue with the accumulation of dynamic range has existed for several years. Nevertheless, no effective solution has been proposed to address the issue.

It may therefore be desirable to provide a method and an apparatus to alleviate the dynamic range issue.

SUMMARY

Some embodiments provide a method of Laplace transform system simulation that includes generating a high-order equation based on a transfer function, the transfer function representing characteristics of at least one s-domain component in a circuit, converting the high-order equation into a state equation comprising a series of state variables, wherein the high-order equation and the state equation have corresponding coefficients for each order and state variable, wherein the coefficients of the state equation have a first dynamic range, and normalizing or mathematically manipulating (hereinafter normalize or normalizing) the coefficients for the state variables by adjusting each state variable with a corresponding factor to obtain a normalized state equation having normalized coefficients, wherein the normalized coefficients of the normalized state equation have a second dynamic range smaller than the first dynamic range.

In addition or in the alternative, some embodiments provide a method of Laplace transform system simulation that includes receiving a circuit design including at least one Laplace component, determining characteristics of the at least one Laplace component, generating a transfer function based on the characteristics of the at least one Laplace component, generating an $n^{th}$-order equation based at least in part on the transfer function, the $n^{th}$-order equation having a first set of variables associated with a first set of coefficients, the first set of coefficients having a first dynamic range, converting the $n^{th}$-order equation into a state equation having a set of state variables, and converting the state equation to a difference equation set consisting of "n" $1^{st}$-order difference equations, the difference equation set having a second set of variables associated with a second set of coefficients, the second set of coefficients having a second dynamic range smaller than the first dynamic range.

Moreover, some embodiments provide an apparatus for Laplace transform system simulation that includes one or more processing units receiving a transfer function, the transfer function representing characteristics of at least one s-domain component in a circuit, and one or more memory units storing information comprising a plurality of program routines. The one or more memory units may comprise a high-order equation generating module, configured to generate a high-order equation based on the transfer function, a state equation generating module, configured to convert the high-order equation into a state equation comprising a series of state variables, wherein the high-order equation and the state equation have corresponding coefficients for each order and state variable, wherein the coefficients of the state equation have a first dynamic range, and a coefficient normalizing module, configured to level the coefficients for the state variables by adjusting each state variable with a corresponding factor to obtain a normalized state equation, wherein the normalized coefficients of the normalized state equation have a second dynamic range smaller than the first dynamic range.

Furthermore, some embodiments provide a non-transitory computer-readable storage medium storing program instructions that when executed cause a computer system to simulate a circuit design by performing operations comprising generating a high-order equation based on a transfer function, the transfer function representing characteristics of at least one s-domain component in the circuit design, converting the high-order equation into a state equation comprising a series of state variables, wherein the high-order equation and the state equation have corresponding coefficients for each order and state variable, wherein the coefficients of the state equation have a first dynamic range, and normalizing the coefficients for the state variables by adjusting each state variable with a corresponding factor to obtain a normalized state equation having normalized coefficients, wherein the normalized coefficients of the normalized state equation have a second dynamic range smaller than the first dynamic range.

BRIEF DESCRIPTION OF THE DRAWINGS

The following detailed description of various exemplary embodiments or exemplary implementations will be better understood when read in conjunction with the appended drawings. It shall be further noted that these exemplary embodiments or exemplary implementations are illustrated by way of examples, and not limited by the accompanying figures, in which like references indicate similar elements.

DESCRIPTION OF THE EMBODIMENTS

Figure 1:
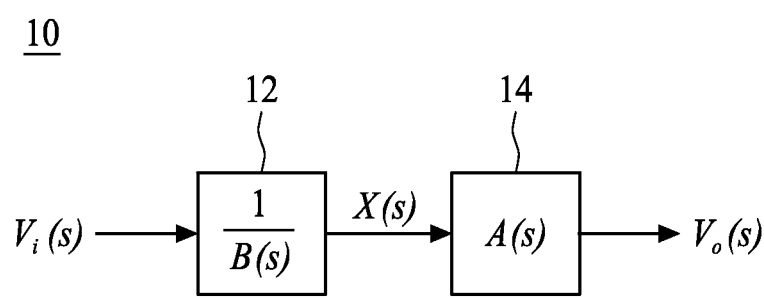
FIG. 1 shows a block diagram schematically illustrating a general stage-divided Laplace transform system in some embodiments.

Detailed description of the appended drawings is intended as a description of the described embodiments, and is not intended to represent the only form in which various embodiments may be practiced. It is to be understood that the same or equivalent functions or purposes may be accomplished by different embodiments that are intended to be encompassed within the spirit and scope of the description.

Some embodiments utilize a Laplace transform system that implements linear continuous-time systems and has diverse applications in electrical systems, optical systems, mechanical systems, and others. Without loss of generality, the embodiments described herein use Laplace filters for the purposes of explaining or illustrating various embodiments described herein. However, various embodiments described herein are not limited to the application to Laplace filters and may be applied to all classes of Laplace transform systems, other types of transforms (e.g., Fast Fourier Transforms (FFT) or discrete Fourier transforms (DFT), or other transforms between multiple domains such as the time domain and the frequency domain, etc.) or s-domain (e.g., the frequency domain) components while achieving the same or substantially identical purposes. Therefore, the Application provides the description involving the Laplace transform or the Laplace filters solely for explanation or illustration purposes unless otherwise specifically recited to the contrary.

For example, the description of some embodiments refers to the Laplace filters. Nonetheless, it shall be understood that various embodiments described herein also apply with other Laplace components in either the time domain or the frequency domain or the representations of various circuit components using other types of transforms with equal effects. It shall be further noted that the description of certain embodiments refers to certain modeling or programming languages. Nonetheless, the reference to such modeling or programming languages is to provide some exemplary languages that may be used to implement the described functions or to achieve some intended functions and is not intended to limit the scope of various other embodiments or implementations or the scope of the claims, unless otherwise specifically recited is such other embodiments or implementations or in such claims.

In various embodiments, the method uses one or more transforms to transform a system (e.g., an electronic circuit) in a first domain (e.g., the continuous or discrete time-domain) to a linear system of equations in a second domain (e.g., the frequency domain or the s-domain), solves the system of equations (e.g., a system of linear equations) to obtain the solutions in the second domain, and apply a corresponding inverse transform to the solutions in the second domain to obtain the solutions in the first domain.

More specifically, some embodiments utilize a multi-stage transfer function or a multi-stage mapping (hereinafter transfer function), which describes relationships between the input and the output of the system to be simulated, by introducing intermediate state(s) in a form of, for example, intermediate state variable(s) to explicitly or implicitly capture both the states of the system under simulation and the dynamic range or to capture both the states of the system and the order of, for example, the Laplace filter(s) or component(s).

One of the advantages of these embodiments is that these embodiments capture not only the states of the system under simulation but also the dynamic range or the order of a polynomial function representing a component and thus more precisely and accurately determine the behavior of the system with, for example, the high-order Laplace filters or components because systems with high-order Laplace filters or components present large a dynamic range leading to an ill-conditioned system of equations that may cause difficulties in various numerical schemes for solving the system of equations and give rise to inaccurate solutions.

Some of these embodiments may then determine a system of equations where each equation in the system of equations may be physically interpreted as having a circuit having a one-farad (1 F) capacitor. Some other embodiments may determine a system of equations not only by using the concept of the one-farad capacitors. Rather, these embodiments normalize or manipulate (hereinafter normalize) the state equation or a converted form thereof with corresponding factors to obtain a normalized state equation. It shall be noted that normalizing the state equation or a converted form thereof comprises an act of adjusting the state equation or a converted form thereof by using corresponding factors, rather than simply treating the system under simulation as a series of one-farad capacitors connected in series. More details about using the multi-stage transfer function for determining the behavior of a system will be provided in subsequent paragraphs by ways of examples.

For circuit simulation, a transfer function of a Laplace transform system may be generated, representing a set of component characteristics in a circuit. After receiving a circuit design, a system simulator may then perform various kinds of analyses based at least in part on the transfer function. The following paragraphs provide an exemplary embodiment in which the Laplace transform is used for the ease of explanation and illustration. Nonetheless, it shall be noted that other transforms may also be used to achieve identical or substantially similar effects. In addition, some assumptions, simplification, or premises are made in the following exemplary embodiment also for the ease of explanation and illustration but are not intended to limit the scope of other embodiments or implementations, unless otherwise specifically recited to the contrary. For example, the transfer function of a Laplace transform system may generally take the form as given in equation (1) below:

$$H(s) = \frac{V_o(s)}{V_i(s)} = \frac{A(s)}{B(s)} \quad (1)$$

where s is the Laplace variable; $V_o(s)$ and $V_i(s)$ respectively represent an output signal and an input signal of the Laplace transform system in the Laplace domain or the frequency domain, respectively; and A(s) and B(s) respectively represent a numerator and denominator of the transfer function in factorization form or polynomial form, respectively.

When the numerator and denominator of the transfer function are represented in polynomial forms, A(s) and B(s) may be generally expressed as:

$$A(s) = a_m s^m + a_{m-1} s^{m-1} + \ldots + a_2 s^2 + a_1 s^1 + a_0 \quad (2)$$

$$B(s) = b_n s^n + b_{n-1} s^{n-1} + \ldots + b_2 s^2 + b_1 s^1 + b_0 \quad (3)$$

where $\{a_m, a_{m-1}, \ldots, a_2, a_1, a_0\}$ and $\{b_n, b_{n-1}, \ldots, b_2, b_1, b_0\}$ denote coefficients of the polynomials representing the numerator and denominator of the transfer function, respectively.

In order to obtain the time-domain or frequency-domain simulation result of the output signal, the method may use a two-stage transform in which the Laplace transform system may be divided into two stages. FIG. 1 is a block diagram schematically illustrating a general stage-divided Laplace transform system 10. As illustrated in FIG. 1, the input signal $V_i(s)$ is provided to the first stage 12 of the Laplace transform system 10, wherein the first stage 12 has a transfer function of $$\frac{1}{B(s)}.$$

The output of the first stage 12 of the Laplace transform system 10 is coupled to an intermediate state or node variable X(s) (hereinafter intermediate state) between the first stage 12 and second stage 14. The intermediate state X(s) is coupled to the input of the second stage 14 of the Laplace transform system 10, wherein the second stage 14 has a transfer function of A(s), and the output of the second stage 14 produces the desired output signal $V_o(s)$.

The input and output relationship of the first stage 12 of the Laplace transform system 10 can be represented by an $n^{th}$-order differential equation shown in the following:

$$b_n s^n X(s) + b_{n-1} s^{n-1} X(s) + \ldots + b_2 s^2 X(s) + b_1 s X(s) + b_0 X(s) = V_i(s) \quad (4)$$

The differential equation (4) may be solved using known numerical techniques in the art.

Numerical methods are, however, limited by the precision of a computer system carrying out the numerical methods or the accuracy of the numerical methods approximating the solutions, and may thus introduce errors to the solution due to, for example, rounding errors. Such errors may render the analysis results of the system simulator inaccurate. The increase in the dynamic range of the coefficients $b_n$, $b_{n-1}, \ldots, b_2, b_1, b_0$ may further exacerbate the problem where such errors become more significant. More details about the dynamic range will be provided in paragraphs below.

Figure 2A:
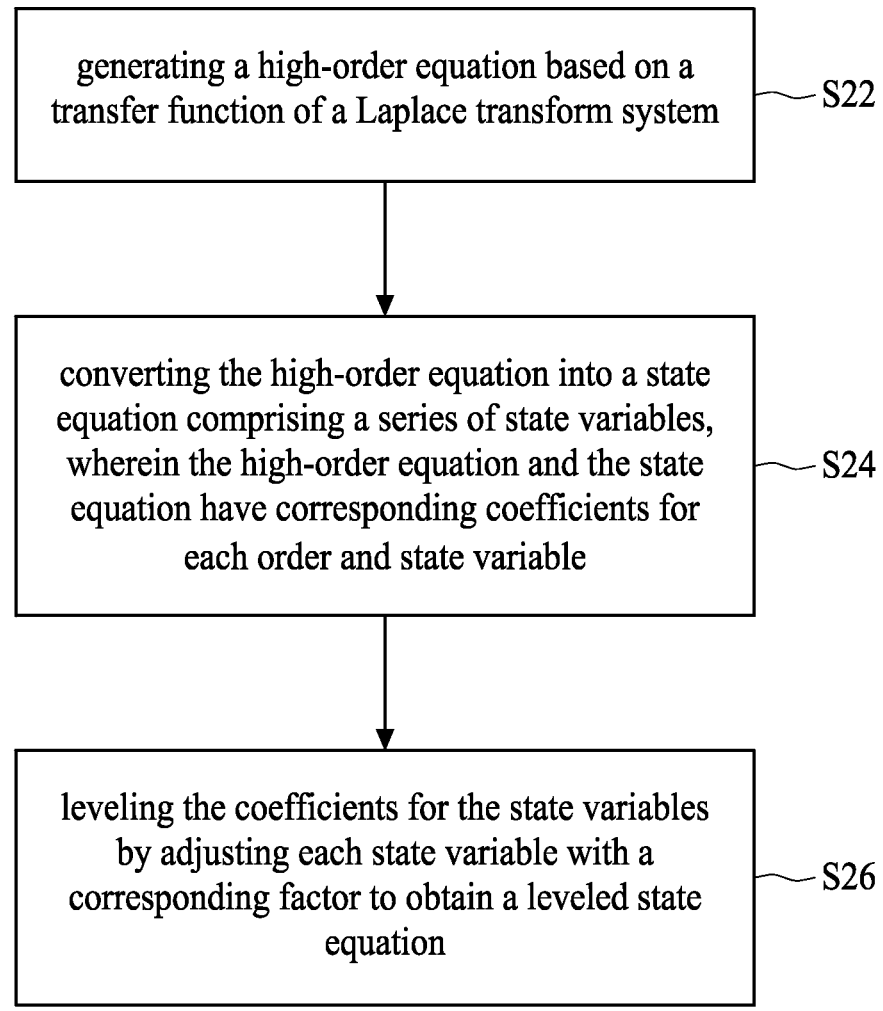
FIG. 2A illustrates a flow diagram illustrating a method of Laplace transform system simulation according to one or more embodiments.

FIG. 2A illustrates a flow diagram illustrating a method of Laplace transform system simulation according to an embodiment of the present invention. Referring to FIG. 2A, according to an embodiment, the method includes the act of generating a high-order equation based at least in part on a transfer function of a Laplace transform system (S22), wherein the transfer function represents a set of component characteristics in a circuit; the act of converting the high-order equation into a state equation comprising a series of state variables, wherein the high-order equation and the state equation have a corresponding coefficient for each state variable (S24) that also captures the order of the high-order equation; and normalizing the coefficients for the state variables by adjusting each state variable with a corresponding factor to obtain a normalized state equation (S26). Unlike some conventional approaches that only consider the states of the system under simulation, some embodiments capture not only the states of the system but also the order of the high-order equation. Moreover, these embodiments capture the order of the high-order equation implicitly, rather than explicitly by using an intermediate state that is coupled to both the output of the first stage of a multi-stage transform as well as the input of the second stage of the multi-stage transform.

In S22, the transfer function of the Laplace transform system is generated by using a filter simulator in some embodiments. When designing a linear continuous-time filter, a behavioral description of the filter is provided to the filter simulator by a designer. The behavioral description specifies the desired frequency response in light of the source impedance and load impedance coupled to the filter, and may, for example, comprise a specification of a center frequency of a desired passband, a 3 dB bandwidth of the passband, a 60 dB bandwidth of the passband, a passband gain, a passband ripple, a stopband attenuation, a source impedance and a load impedance of the filter. Based on the received behavioral description, the filter simulator may generate a transfer function of the filter satisfying the behavioral description. Methods for generating such a transfer function are well known in the art, such as but not limited to Butterworth filters, Chebyshev filters, or Elliptic filters in some embodiments. The highest order of the Laplace filter depends on the behavioral description of the filter, such as the steepness of the transition from passband to stopband, and the type of filter adopted.

The transfer function of the Laplace filter may be represented by equation (1) as previously discussed and recaptured here for convenience:

$$H(s) = \frac{V_o(s)}{V_i(s)} = \frac{A(s)}{B(s)} \quad (1)$$

where A(s) and B(s) represent a numerator and a denominator of the transfer function, respectively, which may be represented in factorization form or polynomial form.

When taking the denominator of the transfer function shown in equation (1) as an example, if the denominator B(s) is represented in polynomial form, then it may be generally expressed by equation (3) as previously discussed and recaptured here for convenience:

$$B(s) = b_n s^n + b_{n-1} s^{n-1} + \ldots + b_2 s^2 + b_1 s^1 + b_0 \quad (3)$$

where $b_n, b_{n-1}, \ldots, b_2, b_1, b_0$ denote coefficients of the polynomial.

When the denominator is represented in factorization form, B(s) may be expressed as equation (5):

$$B(s) = (s - p_1)(s - p_2) \ldots (s - p_n) \quad (5)$$

where $p_1, p_2, \ldots, p_n$ are poles of the Laplace filter, and may be different real numbers, duplicate real numbers, and/or complex conjugates in some embodiments.

By expanding and rearranging equation (5), a coefficient $b_i$ of the $i^{th}$-order term $s^i$ in equation (3) may be shown to be proportional to a sum of a combination of products of i terms selected from the set $$\left\{\frac{1}{p_1}, \frac{1}{p_2}, \ldots, \frac{1}{p_n}\right\}$$

and the coefficient $b_0$ of the zero$^{th}$-order term is 1, assuming the poles $p_1, p_2, \ldots, p_n$ are non-zero. For example, the coefficient $b_2$ of the second-order term $s^2$ is proportional to $$\frac{1}{p_1 p_2} + \frac{1}{p_1 p_3} + \ldots + \frac{1}{p_{n-1} p_n},$$

and the coefficient $b_1$ of the first order term s is proportional to $$\frac{1}{p_1} + \frac{1}{p_2} + \ldots + \frac{1}{p_n}.$$

Each pole $p_i$ is associated with a characteristic frequency of the Laplace filter. Therefore, each coefficient $b_i$ is associated with characteristic frequencies and a respective order i.

In the following, references are made to FIGS. 1 and 2A. In S22, a high-order equation comprising an input signal $V_i(s)$ to the Laplace transform system, a denominator B(s) of the transfer function H(s) and an intermediate state X(s) of the Laplace transform system is generated. As illustrated in FIG. 1, in order to obtain the time-domain or frequency-domain simulation result of the output signal, the Laplace filter 10 is divided into two stages 12 and 14, and an intermediate state X(s) is introduced between the two stages 12 and 14 in some embodiments. The input signal $V_i(s)$ is provided to the first stage 12 of the Laplace transform system 10 which has a transfer function of $$\frac{1}{B(s)},$$

and the output of the first stage 12 is coupled to the intermediate state X(s) in these embodiments. Therefore, the input and output relationship of the first stage 12 of the Laplace transform system 10 may be represented by a high-order equation as previously discussed and recaptured here for convenience:

$$b_n s^n X(s) + b_{n-1} s^{n-1} X(s) + \ldots + b_2 s^2 X(s) + b_1 s X(s) + b_0 X(s) = V_i(s) \quad (4)$$

As previously discussed, when the dynamic range of the coefficients $b_n, b_{n-1}, \ldots, b_0$ is large, analysis inaccuracy due to, for example, limited computer precision or inaccuracies in numerical methods are more pronounced. In some embodiments, a dynamic range of a set of numbers may be defined to be the largest number in the set divided by the smallest number in the set. By representing coefficient $b_i$ in terms of poles $p_1, p_2, \ldots, p_n$ as described above, the dynamic range of the high-order equation (4) may be shown by equation (6):

$$\text{dynamic range} = \frac{b_0}{b_n} = p_1 \cdot p_2 \cdots p_n \quad (6)$$

Therefore, the higher the order n of the Laplace filter is, and the higher the characteristic frequencies associated with the poles are, the larger the dynamic range of the coefficients will be.

Referring to FIG. 2A, in S24, the high-order equation is converted into a state equation comprising a series of state variables, wherein the high-order equation and the state equation have corresponding coefficients for each state variable. According to an embodiment, the high-order equation shown in equation (4) may be converted into a state equation shown in equation (7):

$$b_n x_n + b_{n-1} x_{n-1} + \ldots + b_2 x_2 + b_1 x_1 + b_0 x_0 = V_i(s) \quad (7)$$

wherein $x_n, x_{n-1}, \ldots, x_2, x_1$, and $x_0$ denote state variables.

In a traditional method, the $n^{th}$-order differential equation (7) may be converted to a total number "n" of $1^{st}$-order difference equations (collectively a difference equation set) shown in equation (8) below. It shall be noted that the term "difference equations" do not necessarily imply that these equations are obtained by using the finite difference method. Rather, these "difference equations" may also be derived by other suitable numerical methods such as but not limited to the finite element method or any other numerical methods for approximating the solutions to the differential equations.

$$x_0 = X(s)$$

$$x_1 = s x_0 = s X(s)$$

$$x_2 = s x_1 = s^2 X(s)$$

$$\ldots$$

$$x_{n-1} = s x_{n-2} = s^{n-1} X(s)$$

$$x_n = s x_{n-1} = s^n X(s) \quad (8)$$

In the equation (8), the $i^{th}$ state variable $x_i$ is represented by:

$$x_i = s x_{i-1} \quad (8a)$$

Each may be interpreted as a circuit including a 1-farad (1 F) capacitor. Hence the entire set of equation (8), from the physical perspective, represents a circuit including "n" 1 F capacitors connected in series. Because the dynamic range of each mathematical relationship between $x_{i-1}$ and $x_i$ is proportional to "s" in this example, the dynamic range is large in a high frequency system and may thus be accumulated in the entire set of equation (8) due to the capacitors connected in series.

Based on the equations (7) and (8), the problem of solving the high-order equation (4) may be re-formulated as a problem of solving a first-order difference equation set, shown in equation (9):

$$\begin{bmatrix} \dot{x}_0 \\ \dot{x}_1 \\ \dot{x}_2 \\ \vdots \\ \dot{x}_{n-1} \end{bmatrix} = \begin{bmatrix} 0 & 1 & 0 & 0 & \cdots & 0 \\ 0 & 0 & 1 & 0 & \cdots & 0 \\ 0 & 0 & 0 & 1 & \cdots & 0 \\ \vdots & & & & & \\ -\frac{b_0}{b_n} & -\frac{b_1}{b_n} & -\frac{b_2}{b_n} & -\frac{b_3}{b_n} & \cdots & -\frac{b_{n-1}}{b_n} \end{bmatrix} \begin{bmatrix} x_0 \\ x_1 \\ x_2 \\ \vdots \\ x_{n-1} \end{bmatrix} + \begin{bmatrix} 0 \\ 0 \\ 0 \\ \vdots \\ 1/b_n \end{bmatrix} V_i(s) \quad (9)$$

where $\dot{x}_i$ denotes the derivative of the state variable $x_i$. The coefficient matrix of the state variables $x_0, \ldots, x_{n-1}$ have a large dynamic range as indicated in the equation (9). Specifically, the dynamic range is accumulated into one difference equation and has a value as large as $b_0/b_n$ as stated in equation (6). In some cases, such a large dynamic range may result in an ill-conditioned system of equations for, for example, equation (9).

Figure 3:
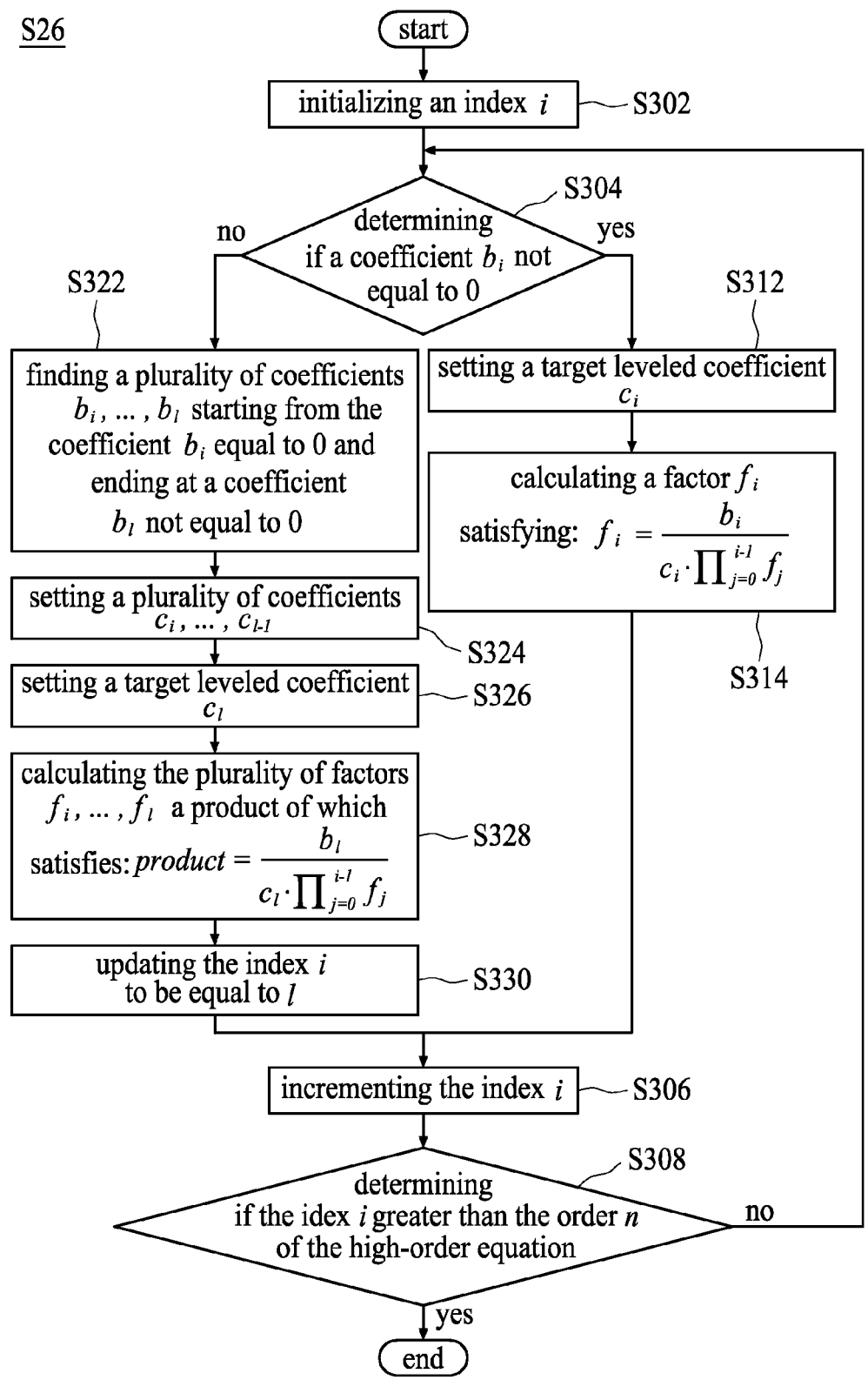
FIG. 3 illustrates a flow diagram illustrating a process of normalizing coefficients according to one or more embodiments.

Referring to FIG. 2A, in S26, the coefficients of the state variables may be normalized by adjusting each state variable with a corresponding factor to obtain a normalized state equation. FIG. 3 is a flow diagram illustrating a process of normalizing the coefficients according to an embodiment of the present invention.

Referring to FIG. 3, the process of normalizing the coefficients $b_n, b_{n-1}, \ldots, b_2, b_1, b_0$ for the state variables $x_n, x_{n-1}, \ldots, x_2, x_1, x_0$ includes the following acts. In S302, an index i is initialized. According to an embodiment, the index i is initialized to assume the value zero.

Then, in S304, if a coefficient $b_i$ of a state variable $x_i$ is not equal to zero, S312 is performed; otherwise, S322 is performed.

For the state variable $x_i$ of which the coefficient $b_i$ is not equal to zero, a target normalized coefficient $c_i$ is set in S312. According to an embodiment, the target normalized coefficient $c_i$ is set as one.

In S314, the corresponding factor $f_i$ of the state variable $x_i$ is calculated by the following equation:

$$f_i = \frac{b_i}{c_i \cdot \prod_{j=0}^{i-1} f_j} \quad (10)$$

where $c_i$ and $f_i$ represent the target normalized coefficient and the corresponding factor of the state variable $x_i$ with an index i, respectively, and $f_j$ represents a corresponding factor of a state variable $x_j$ with an index j which steps through the values from 0 to i−1 for the current index i.

According to an embodiment, when the index i is equal to zero, the term $$\prod_{j=0}^{i-1} f_j$$

is defined to be one.

For the state variable $x_i$ whose corresponding coefficient $b_i$ is equal to zero, a plurality of state variables $x_i, \ldots, x_l$ starting from a first state variable $x_i$ whose corresponding coefficient $b_i$ first becomes zero from a previous non-zero coefficient $b_{i-1}$, and ending at a second state variable $x_l$ whose corresponding coefficient $b_l$ becomes non-zero from a previous zero coefficient $b_{l-1}$ are determined in S322.

In S324, the target normalized coefficients $c_i, \ldots, c_{l-1}$ are determined. According to an embodiment, the target normalized coefficients $c_i, \ldots, c_{l-1}$, corresponding to coefficients $b_i, \ldots, b_{l-1}$, which are equal to zero, are set to be zero.

In S326, the target normalized coefficient $c_l$ of the second state variable $x_l$ is determined. According to an embodiment, the target normalized coefficient $c_l$ is set to be one.

Subsequently, in S328, a plurality of corresponding factors $f_i, \ldots, f_l$ of the plurality of state variables $x_i, \ldots, x_l$ are determined such that a product of the plurality of factors $f_i, \ldots, f_l$ satisfies the following:

$$\text{product} = \frac{b_l}{c_l \cdot \prod_{j=0}^{i-1} f_j} \quad (11)$$

wherein $b_l$ and $c_l$ respectively represent the coefficient and the target normalized coefficient of the second state variable $x_l$ with an index l, and i represents an index of the first state variable $x_i$, and $f_j$ represents a corresponding factor of a state variable $x_j$ with an index j which steps through the values from 0 to i−1 for the current the index i.

According to an embodiment, each corresponding factor $f_i, \ldots,$ or $f_l$ of the plurality of state variables $x_i, \ldots, x_l$ satisfies the following:

$$f_m = (\text{product})^{\frac{1}{l-i+1}} \quad (12)$$

where $f_m$ represents a corresponding factor of one of the plurality of state variables $x_i, \ldots, x_l$, and l−i+1 represents the number of the plurality of state variables $x_i, \ldots, x_l$.

In S330, the index i is assigned the value of l. Both S314 and S330 may proceed to S306, at which the index i is incremented.

In S308 where the index i is not greater than the order n of the high-order equation shown in equation (4), S304 and the subsequent acts are repeated; otherwise, the process of normalizing the coefficients $b_n, b_{n-1}, \ldots, b_2, b_1, b_0$ of the state variables $x_n, x_{n-1}, \ldots, x_2, x_1, x_0$ is completed. The resulting difference equation set in this example is shown by equations (13) and equation (14):

$$x_0' = f_0 X(s)$$

$$x_1' = f_1 s x_0'$$

$$x_2' = f_2 s x_1'$$

$$\ldots$$

$$x_{n-1}' = f_{n-1} s x_{n-2}'$$

$$x_n' = f_n s x_{n-1}' \quad (13)$$

$$c_n x_n' + c_{n-1} x_{n-1}' + \ldots + c_2 x_2' + c_1 x_1' + c_0 x_0' = V_i(s) \quad (14)$$

where $x_n', x_{n-1}', \ldots, x_2', x_1', x_0'$ are state variables adjusted by factors $f_n, f_{n-1}, \ldots, f_2, f_1, f_0$, and equation (14) is the normalized state equation.

Based on equations (13) and (14), the first-order difference equation set with normalized coefficient matrix may be represented by equation (15):

$$\begin{bmatrix} f_1 x'_0 \\ f_2 x'_1 \\ f_3 x'_2 \\ \vdots \\ f_n x'_{n-1} \end{bmatrix} = \begin{bmatrix} 0 & 1 & 0 & 0 & \cdots & 0 \\ 0 & 0 & 1 & 0 & \cdots & 0 \\ 0 & 0 & 0 & 1 & \cdots & 0 \\ \vdots & & & & & \\ -\frac{c_0}{c_n} & -\frac{c_1}{c_n} & -\frac{c_2}{c_n} & -\frac{c_3}{c_n} & \cdots & -\frac{c_{n-1}}{c_n} \end{bmatrix} \begin{bmatrix} x'_0 \\ x'_1 \\ x'_2 \\ \vdots \\ x'_{n-1} \end{bmatrix} + \begin{bmatrix} 0 \\ 0 \\ 0 \\ \vdots \\ 1/c_n \end{bmatrix} V_i(s) \quad (15)$$

It shall be noted that the above formulation, such as Eq. (13) and Eq. (15), further illustrates the implicit capturing of the dynamic range or the order n of high-order equation, in addition to the states of the system under simulation in these embodiments in that although these embodiments do not explicitly define variables for the order n or the dynamic range, these embodiments nonetheless considers the dynamic range or the order n by incorporating the dynamic range or the order n into the solution process by, for example, using the intermediate state(s) in the solution process.

According to some embodiments, the $n^{th}$-order differential equation (7) may be converted into "n" $1^{st}$-order difference equations (collectively a difference equation set) as shown in equation (13). Each mathematical relationship between $x_{i-1}'$ and $x_i'$ may be seen as a circuit including a capacitor with the capacitance $f_i$ F, rather than a circuit including a one-farad capacitor as in some other embodiments. Hence, equation (14), from the physical perspective, represents a circuit consisting of "n" $f_i$ F capacitors connected in series in these embodiments. Accordingly, if appropriate capacitor values of $f_i$ are identified, the identification of which may depend on one or more desired characteristics of the Laplace component, the dynamic range of each mathematical relationship between $x_{i-1}'$ and $x_i'$ may thus be decreased. Moreover, in equation (15), the dynamic range of the last difference equation may be as small as 1.0, if $c_i$ is normalized to 1.0 as in FIG. 4 because the large dynamic range originally accumulated into one difference equation as in the case of equation (9) is well averaged into the whole difference equation set, and the dynamic range of the $i^{th}$ state equation is equal to $f_i$.

$$f_i = \frac{b_i}{c_i \cdot \prod_{j=0}^{i-1} f_j} = \frac{b_i}{b_{i-1}} (\text{if } c_i = 1 \text{ and } f_0 = b_0) \quad (10a)$$

Accordingly, the issue of accumulation of dynamic range may thus be resolved in these embodiments. Specifically, the large dynamic range originally accumulated into one difference equation may be averaged or distributed into the entire difference equation set. Therefore, the dynamic range of the state variables adjusted by the factors may be significantly reduced while the poles or zeros of the Laplace filter (e.g., the component characteristics of the circuit), remain unchanged.

Figure 2B:
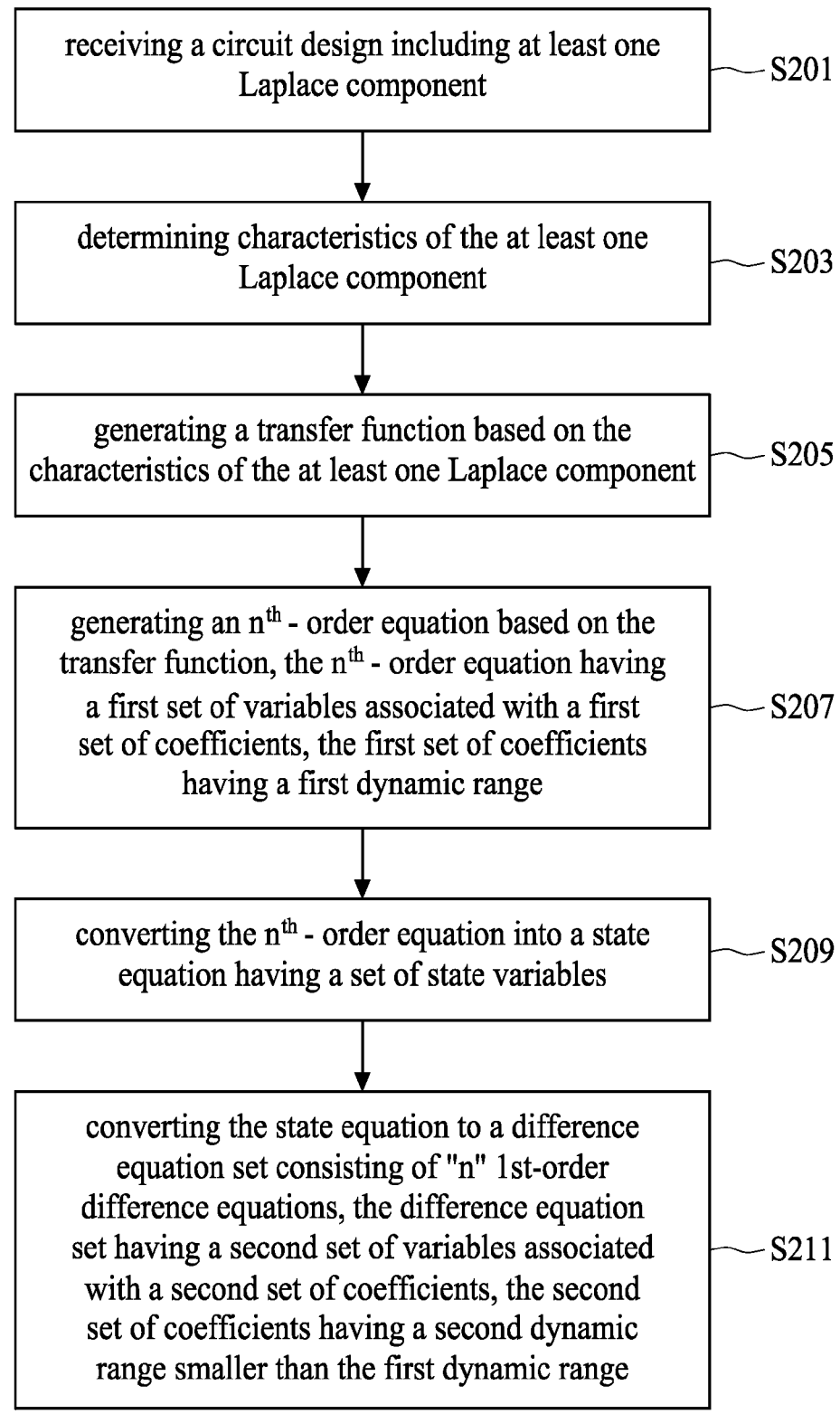
FIG. 2B illustrates a flow diagram illustrating a method of Laplace transform system simulation according to one or more embodiments.

FIG. 2B shows a flow diagram illustrating a method of Laplace transform system simulation according to another embodiment of the present invention. Referring to FIG. 2B, in S201, a circuit design including at least one Laplace component is received in some embodiments. The Laplace component may include but is not limited to a Laplace filter. It shall be noted that a Laplace component is a circuit feature that is represented in the Laplace domain or the frequency domain (the s-domain.) It shall also be noted that if a circuit feature is not yet in the Laplace domain in some other embodiments, such a circuit feature may be converted into the Laplace domain by using any known techniques. Therefore, the term "Laplace component" accommodate both scenarios where the circuit feature is already represented in the Laplace domain or frequency domain, and where the circuit feature is not yet represented (e.g., the circuit feature may be represented in the time domain) but can be represented (e.g., by transformation) in the Laplace domain or the frequency domain.

In S203, one or more characteristics of the at least one Laplace component are determined. In one embodiment, a Laplace filter may be integrated in a netlist, which may describe the component characteristics in Verilog-A language or Verilog-AMS language or other suitable modeling languages. It shall be noted throughout the application that the specific languages referred to herein are for illustration purposes and are not intended to limit the scope of various other embodiments or the scope of the claims, unless otherwise specifically recited.

In S205, a transfer function is generated based at least in part on the one or more characteristics of the at least one Laplace component. In one embodiment, the transfer function may be expressed in a zero-pole format. In another embodiment, the transfer function may be expressed in a zero-denominator format. In still another embodiment, the transfer function may be expressed in a numerator-pole format. Furthermore, in yet still another embodiment, the transfer function may be expressed in a numerator-denominator format.

In S207, an $n^{th}$-order equation, n being a natural number, may be generated based at least in part on the transfer function in some embodiments. The $n^{th}$-order equation, such as one represented by equation (4), represents a Laplace transform system and has a first set of variables associated with a first set of coefficients, which has a first dynamic range.

In S209, the $n^{th}$-order equation is converted to a state equation, such as one represented by equation (7), having a set of state variables.

In S211, the state equation is converted to a difference equation set, such as one represented by equation (14), consisting of "n" $1^{st}$-order difference equations, such as those represented by equation (13). In one embodiment, the state equation is converted to the difference equation set in a normalization process by adjusting each of a plurality of state variable with a corresponding factor. As a result, the difference equation set has a second set of variables associated with a second set of coefficients, which has a second dynamic range smaller than the first dynamic range. In one embodiment, the second dynamic range is 1.

Figure 4:
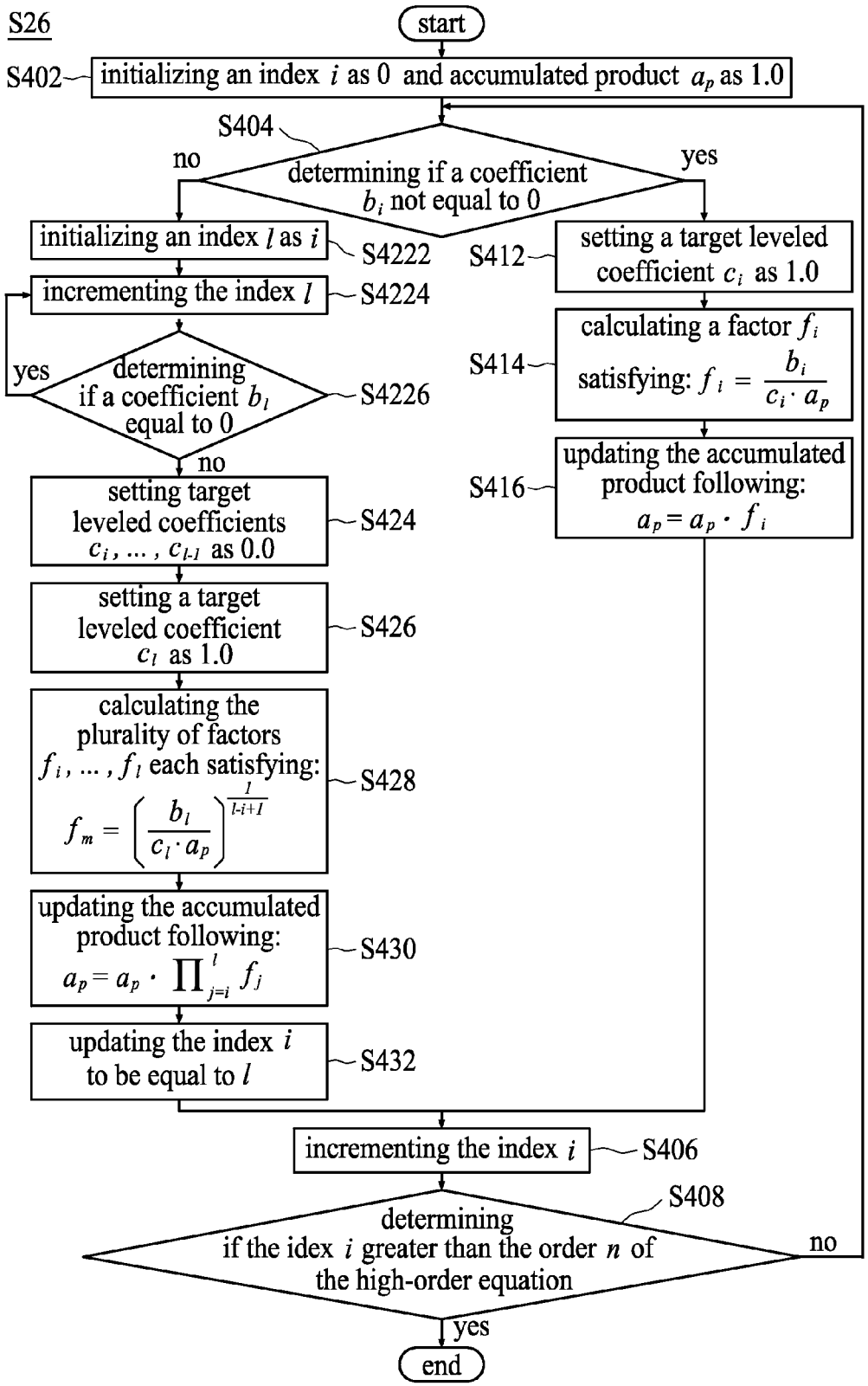
FIG. 4 illustrates a flow diagram illustrating a process of normalizing coefficients according to one or more embodiments.

FIG. 4 is a flow diagram illustrating a process of normalizing the coefficients according to another embodiment of the present invention. Referring to FIG. 4, the process of normalizing the coefficients $b_n$, $b_{n-1}$, . . . , $b_2$, $b_1$, $b_0$ for the state variables $x_n$, $x_{n-1}$, . . . , $x_2$, $x_1$, $x_0$ includes the following acts. In S402, an index i and an accumulated product $a_p$ are respectively initialized to be zero and one.

In S404, if a coefficient $b_i$ of a state variable $x_i$ is not equal to zero, S412 is performed; otherwise, S4222 is performed.

For the state variable $x_i$ of which the coefficient $b_i$ is not equal to zero, a target normalized coefficient $c_i$ may be set as one in S412. Next, in S414, the corresponding factor $f_i$ of the state variable $x_i$ may be determined by the following equation:

$$f_i = \frac{b_i}{c_i \cdot a_p} \quad (16)$$

where $c_i$, and $f_i$ respectively represent the target normalized coefficient and the corresponding factor of the state variable $x_i$ with an index i.

In S416, the accumulated product $a_p$ may be updated by following equation (17):

$$a_p = a_p \cdot f_i \quad (17)$$

For the state variable $x_i$ whose corresponding coefficient $b_i$ is zero, an index l is initialized to be i in S4222.

In S4224 and S4226, the index l may be incremented until a state variable $x_l$ with a corresponding non-zero coefficient $b_l$ is encountered.

In S424, the target normalized coefficients $c_i, \ldots, c_{l-1}$ are assigned the value zero.

In S426, the target normalized coefficient $c_l$ of the state variable $x_l$ is assigned the value one.

In S428, a plurality of corresponding factors $f_i, \ldots, f_l$ of the plurality of state variables $x_i, \ldots, x_l$ may be determined, wherein each corresponding factor $f_m$ satisfies the following equation:

$$f_m = \left(\frac{b_l}{c_l \cdot a_p}\right)^{\frac{1}{l-i+1}} \quad (18)$$

where $f_m$ represents a corresponding factor of one of the plurality of state variables $x_1, \ldots, x_l$, and l−i+1 represents the number of the plurality of state variables $x_i, \ldots, x_l$.

In S430, the accumulated product $a_p$ may be updated using the following equation (19):

$$a_p = a_p \cdot \prod_{j=i}^{l} f_j \quad (19)$$

In S432, the index i may be assigned the value of l.

Both S416 and S432 may proceed to S406, at which the index i is incremented.

In S408 where the index i is not greater than the order n of the high-order equation shown in equation (4), S404 and the subsequent acts may be repeated; otherwise, the process of normalizing the coefficients $b_n, b_{n-1}, \ldots, b_2, b_1, b_0$ of the state variables $x_n, x_{n-1}, \ldots, x_2, x_1, x_0$ is completed.

It is noted that there exist alternative, equivalent implementations of the exemplary embodiments shown in FIGS. 3 and 4. For example, the sequence of the acts may be altered. For example, if the target normalized coefficients are respectively initialized to one or zero in S302 or S402 and are respectively changed into zero or one according to corresponding coefficients being zero or non-zero, then, in the embodiment shown in FIG. 3, either S324 or S312 and S326 may not be needed, and in the embodiment shown in FIG. 4, either S424, or S426 and S414 may not be needed.

According to an embodiment, the high-order Laplace transform system simulation method may be stored in a non-transitory computer-readable recording medium for allowing a computer system to perform the method.

Figure 5:
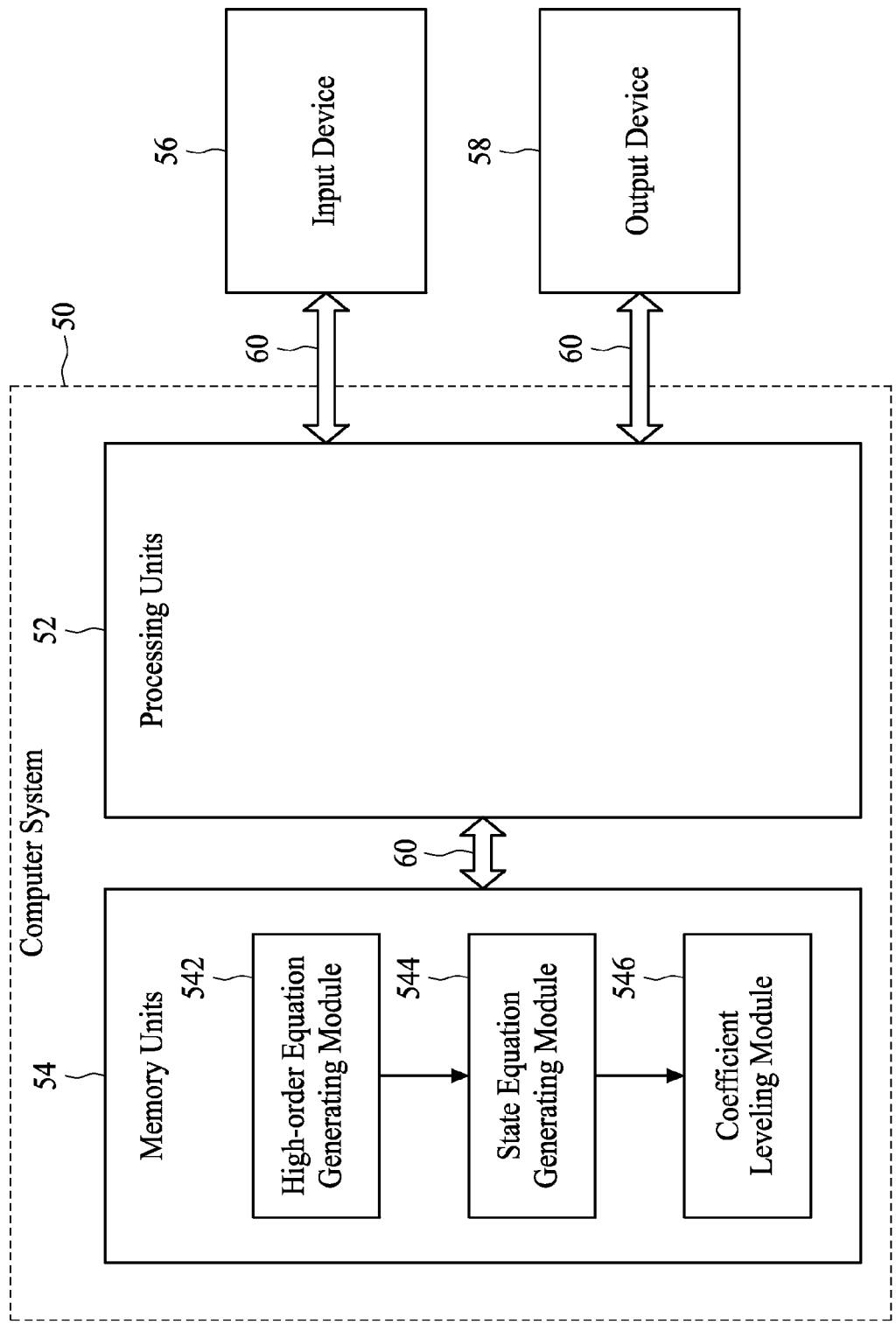
FIG. 5 shows a schematic block diagram illustrating an apparatus for Laplace transform system simulation according to one or more embodiments.

FIG. 5 is a schematic block diagram illustrating an apparatus 50 for Laplace transform system simulation according to another embodiment of the present invention.

Referring to FIG. 5, the Laplace transform system simulation apparatus 50 according to an embodiment comprises a computer system that includes one or more processing units 52, and one or more memory units 54. An input device 56 and an output device 58 are coupled to the apparatus 50 through a bus structure 60. The input device 56 may be a keyboard, a mouse or other devices that allows a user to input, for example, a behavioral description of the Laplace filter to the apparatus 50. The output device 58 may be a display device for displaying the analysis result generated by the apparatus 50. The one or more processing units 52 are coupled to the one or more memory units 54 through the bus structure 60. The one or more memory units 54 may include a random access memory (RAM), read-only memory (ROM), and/or secondary storage unit such as a hard disk or an optical disc drive. The one or more memory units 54 store information including a plurality of program routines, and the one or more processing units are configured to control the execution of the plurality of program routines. According to an embodiment, the plurality of program routines comprise a high-order equation generating module 542, a state equation generating module 544 and a coefficient normalizing module 546. Also, according to an embodiment, the high-order equation generating module 542 is configured to generate a high-order equation based on a transfer function of a Laplace transform system, wherein the transfer function exhibits a set of component characteristics and/or a behavioral description associated with an integrated circuit, and wherein the high-order equation comprising an input signal to the Laplace transform system, a denominator of the transfer function and an intermediate state of the Laplace transform system. The state equation generating module 544 is configured to convert the high-order equation into a state equation comprising a series of state variables, wherein the high-order equation and the state equation have corresponding coefficients for each order and state variable. The coefficient normalizing module 546 is configured to level the coefficients for the state variables by adjusting each state variable with a corresponding factor to obtain a normalized state equation. Detail operations of the foregoing modules have been provided above and are omitted here for brevity.

Figure 6:
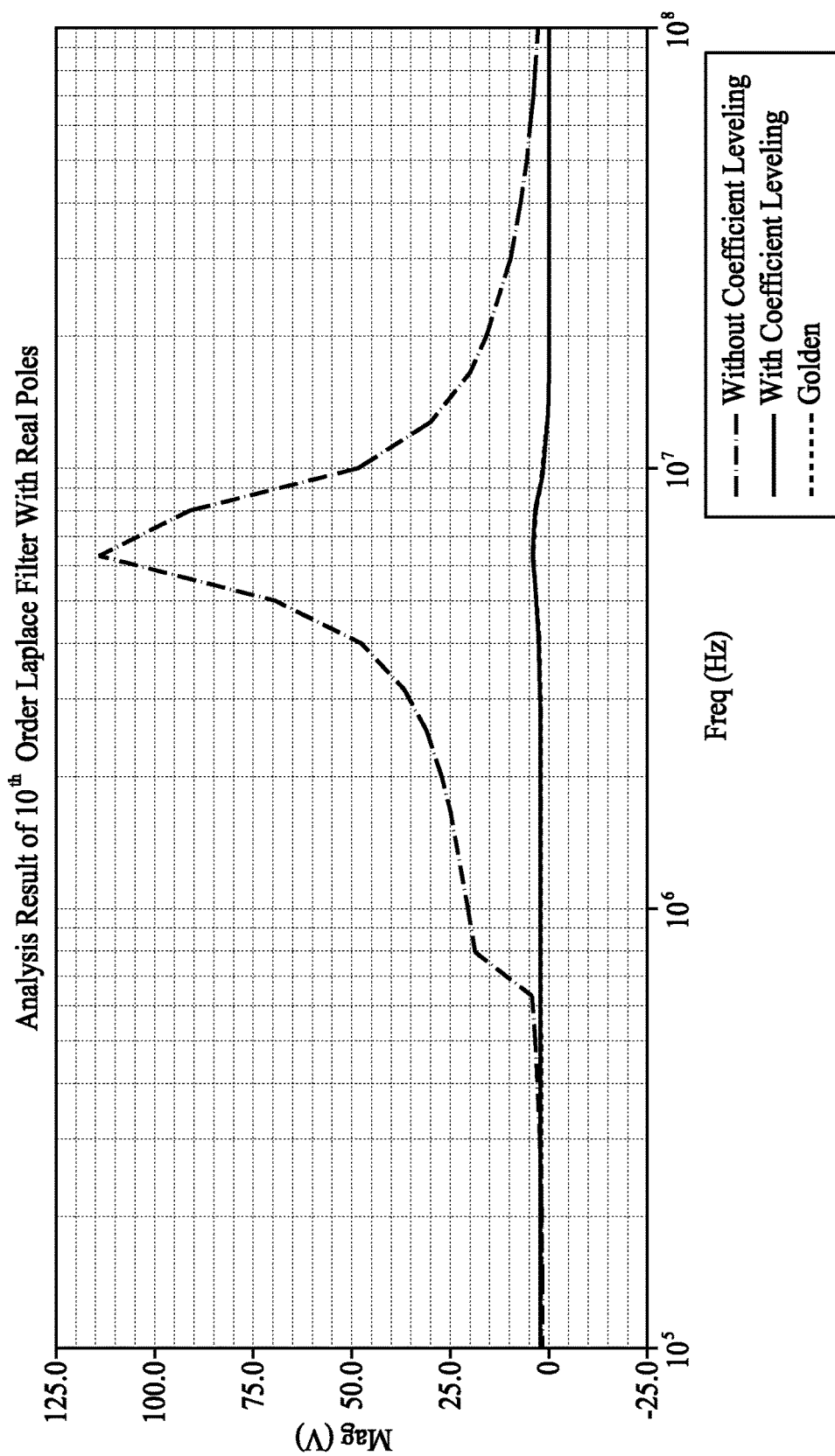
FIGS. 6 and 7 respectively illustrate some exemplary analysis results of $10^{th}$-order Laplace filters with real poles and complex conjugate poles in some embodiments.
Figure 7:
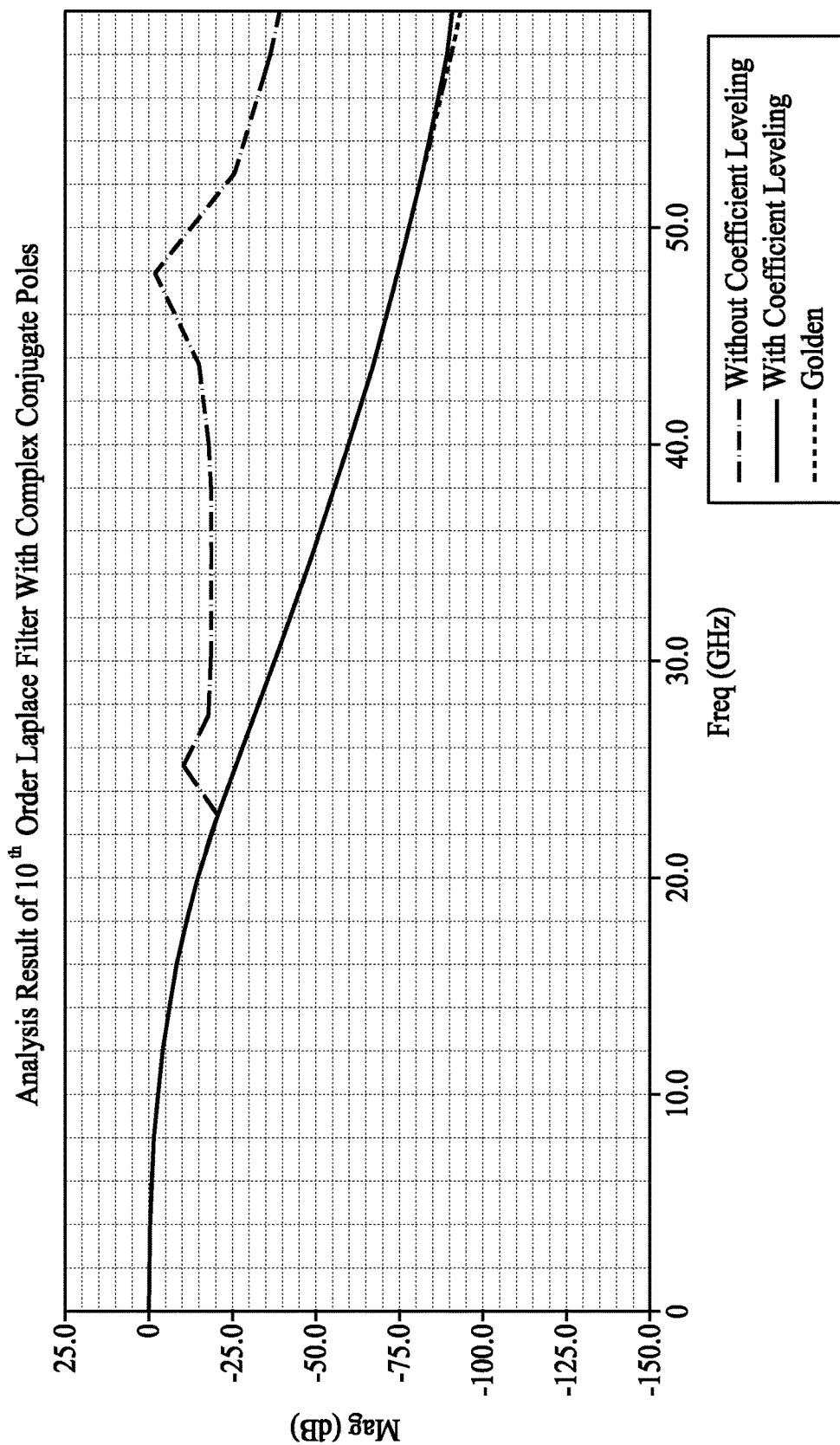

FIGS. 6 and 7 show analysis results of $10^{th}$-order Laplace filter with real poles and complex conjugate poles, respectively. The pole definitions are provided to the filter simulator using Verilog A. The analysis results are obtained from numerical equation solving with coefficient normalization and without coefficient normalization, and are compared with golden results obtained from closed-form solutions. As shown in both FIGS. 6 and 7, the analysis results without coefficient normalization deviate significantly from the golden results, while the analysis results obtained with coefficient normalization closely match the golden results. It is noted that because numerical techniques or methods for a transfer function may be applied to various types of analysis, such as but not limited to periodic steady state analysis that computes the periodic steady-state response of an RF system, and periodic AC analysis that computes the small-signal periodic steady-state response of an RF system, some embodiments may generally enhance analysis accuracy for various kinds of analyses.

In addition, the accuracy of the analyses will not be significantly affected by changes in the poles or zeros or order of the Laplace transform system with various embodiments described herein. For example, the accuracy of analyses is not significantly affected by changes in the characteristic frequencies or in the order of the Laplace filter.

Various embodiments described herein are directed to a high-order Laplace transform system simulation method and apparatus that convert a high order equation based at least in part on a transfer function of the Laplace transform system into a state equation, and normalize the coefficients of the state equation by adjusting each of a set of state variables with a corresponding factor. In these embodiments, analysis inaccuracy due to limited computer precision or limited accuracy of numerical techniques may be improved.

While various embodiments have been illustrated and described, it is clear that various embodiments are not limited to these described embodiments only. Numerous modifications, changes, variations, substitutions, and equivalents will be apparent to those skilled in the art, without departing from the spirit and scope of the described embodiments, as described in the claims.

What is claimed is:

1. A computer implemented method of determining behavior of a system in a first domain, comprising:
at least one processor or processor core of a computing system executing one or more threads of execution to perform a process, the process comprising:
identifying a relationship that describes behavior of the system in response to an input comprising at least one analog signal to the system that exhibits a first dynamic range, wherein the system includes one or more blocks of integrated circuit components, and a dynamic range indicates an extent of variation among a plurality of multiplicative factors of respective elements in an expression for the system;
enhancing computational accuracy of the computing system at least by reducing, with at least a normalization module stored at least partially in memory of the computing system, the first dynamic range into a second dynamic range at least by transforming, at multiple modules stored in a plurality of memory units of the computing system and coupled to one or more processing units of the computing system in accordance with semiconductor manufacturing requirements pertaining to functions of the system, the system with at least the relationship in multiple stages into a transformed system that exhibits the second dynamic range, wherein the second dynamic range is less than the first dynamic range; and
determining the behavior of the system by using at least the transformed system exhibiting the second dynamic range.

2. The computer implemented method of claim 1, wherein the relationship includes a multi-stage transfer function in a first domain.

3. The computer implemented method of claim 2, the process further comprising:
generating a high-order equation based at least in part upon the multi-stage transfer function, the transfer function representing characteristics of at least one s-domain component in a circuit.

4. The computer implemented method of claim 3, the process further comprising:
converting the high-order equation into a state equation that a set of state variables, wherein the high-order equation and the state equation have corresponding coefficients that capture both the set of state variables and an order of the high-order equation, wherein coefficients of the state equation have the first dynamic range.

5. The computer implemented method according to claim 4, wherein an act of normalizing the coefficient comprises, for a state variable whose coefficient is not zero:
determining a corresponding geometric average for a corresponding factor of a state variable whose coefficient is not zero; and
modifying the coefficient of the state variable with the geometric average.

6. The computer implemented method according to claim 4, wherein determining the corresponding geometric average for the corresponding factor comprises:
setting a target normalized coefficient for the state variable; and
determining a corresponding factor of the state variable by using:

$$f_i = \frac{b_i}{c_i \cdot \prod_{j=0}^{i-1} f_j},$$

wherein $b_i$, $c_i$, and $f_i$ respectively represent the coefficient, the target normalized coefficient, and the corresponding factor of the state variable with an index i, and $f_j$ represents the corresponding factor of the state variable with an index j which steps through values from zero to i−1 for the index i.

7. The computer implemented method according to claim 6, wherein the target normalized coefficient of the state variable is assigned a value of one.

8. The computer implemented method according to claim 7, wherein each corresponding factor of the plurality of state variables satisfies:

$$f_m = (\text{product})^{\frac{1}{l-i+1}}$$

wherein $f_m$ represents the corresponding factor of one of the plurality of state variables, and l−i+1 represents a total number of the plurality of state variables.

9. The computer implemented method according to claim 7, wherein the target normalized coefficient of the second state variable is assigned a value of one.

10. The computer implemented method according to claim 7, wherein the process of normalizing the coefficients further comprises assigning a value of zero to each target normalized coefficient whose corresponding coefficient is zero.

11. The computer implemented method according to claim 4, wherein normalizing the coefficients by adjusting the coefficients with a corresponding factor comprises:
when a first coefficient of a first state variable is not zero, setting a first target normalized coefficient for the first state variable; and
determining the corresponding factor of the first state variable by using at least:

$$f_i = \frac{b_i}{c_i \cdot \prod_{j=0}^{i-1} f_j}$$

wherein $b_i$, $c_i$, and $f_i$ represent the coefficient, the target normalized coefficient, the corresponding factor of the first state variable with an index i, respectively, and $f_j$ represents the corresponding factor of a second state variable with an index j which steps through values from zero to i−1 for the index i; and when a second coefficient of a second state variable is zero, identifying a plurality of state variables that include state variables starting from a third state variable whose coefficient becomes zero and ending at a fourth state variable whose coefficient becomes non-zero;

setting a target normalized coefficient of the fourth state variable; and calculating a plurality of corresponding factors of the plurality of state variables such that a product of the plurality of factors satisfies:

$$\text{product} = \frac{b_l}{c_l \cdot \prod_{j=0}^{i-1} f_j},$$

wherein $b_l$ and $c_l$ represent the coefficient and the target normalized coefficient of the fourth state variable with an index l, respectively, i represents an index of the third state variable, and $f_j$ represents a corresponding factor of a state variable with an index j which steps through values from zero to i−1 for the index i.

12. The computer implemented method according to claim 3, wherein a coefficient of the high-order equation is determined from characteristic frequencies and a respective order associated with the coefficient.

13. The computer implemented method of claim 12, further comprising:
generating an equation based at least in part on the transfer function, the equation having a first set of variables associated with a first set of coefficients with a first dynamic range;
converting the equation into a state equation having a set of state variables; and
converting the state equation to a set of equations including a number of first-order equations, the set of equations having a second set of variables associated with a second set of coefficients with a second dynamic range that is smaller than the first dynamic range.

14. The computer implemented method of claim 2, the process further comprising:
normalizing coefficients for the state equation by adjusting the coefficients with a corresponding factor to obtain a normalized state equation having normalized coefficients, wherein the normalized coefficients have the second dynamic range.

15. The computer implemented method according to claim 14, wherein in the corresponding factor of the state variable satisfies:

$$f_i = \frac{b_i}{c_i \cdot \prod_{j=0}^{i-1} f_j},$$

wherein $$\prod_{j=0}^{i-1} f_j$$

has a value of one when the index i is equal to zero.

16. The computer implemented method of claim 1, the process further comprising:
transforming the behavior of the system by using an inverse transform to generate simulation results of the system.

17. The computer implemented method of claim 1, the act of transforming the system by using the at least the relationship comprising:
identifying or determining an intermediate state for the system that links the multiple stages in transforming the system and corresponds to both a set of states of the system and the first dynamic range.

18. The computer implemented method of claim 17, the act of transforming the system by using the at least the relationship further comprising:
converting a system equation representing the system into a set of equations that represents the transformed system and exhibits the second dynamic range by using at least the intermediate state.

19. The computer implemented method according to claim 1, wherein normalizing the coefficients comprises, for a plurality of state variables, starting from a first state variable whose first coefficient has a first value of zero and ending at a second state variable whose second coefficient has a non-zero value,
setting a target normalized coefficient of the second state variable; and
determining a plurality of corresponding factors of the plurality of state variables such that a product of the plurality of factors satisfies:

$$\text{product} = \frac{b_l}{c_l \cdot \prod_{j=0}^{i-1} f_j},$$

wherein $b_l$ and $c_l$ represent the coefficient and the target normalized coefficient of the second state variable with an index l, respectively, i represents an index of the first state variable, and $f_j$ represents a corresponding factor of a state variable with an index j which is prior to the index i.

20. The computer implemented method according to claim 1, wherein in a state variable is adjusted by multiplying the state variable by a corresponding factor during normalizing the coefficient.

21. The computer implemented method according to claim 20, wherein a corresponding factor for the plurality of state variables satisfies:

$$f_m = (\text{product})^{\frac{1}{l-i+1}}$$

wherein $f_m$ represents the corresponding factor of a state variable of the plurality of state variables, and l−i+1 represents a total number of the plurality of state variables.

22. An article of manufacture comprising a non-transitory computer-readable storage medium storing program instructions that when executed by at least one processor or at least one processor core of a computer system cause the computer system to simulate an integrated circuit design by performing operations comprising:

identifying a relationship that describes behavior of the system in response to an input comprising at least one analog signal to the system that exhibits a first dynamic range, wherein the system includes one or more blocks of semiconductor components, and a dynamic range indicates an extent of variation among a plurality of multiplicative factors of respective elements in an expression for the system;

enhancing computational accuracy of the computing system at least by reducing, with at least a normalization module stored at least partially in memory of the computing system, the first dynamic range into a second dynamic range at least by transforming, at multiple modules stored in a plurality of memory units of the computing system and coupled to one or more processing units of the computing system in accordance with semiconductor manufacturing requirements pertaining to functions of the system, the system with at least the relationship in multiple stages into a transformed system that exhibits the second dynamic range, wherein the second dynamic range is less than the first dynamic range; and determining the behavior of the system by using at least the transformed system exhibiting the second dynamic range.

23. An apparatus for simulating an integrated circuit design by performing operations comprising:
at least one processor or one processor core that is at least to:

identify a relationship that describes behavior of the system in response to an input comprising at least one analog signal to the system that exhibits a first dynamic range, wherein the system includes one or more blocks of semiconductor components, and a dynamic range indicates an extent of variation among a plurality of multiplicative factors of respective elements in an expression for the system;

enhance computational accuracy of the computing system at least by reducing, with at least a normalization module stored at least partially in memory of the computing system, the first dynamic range into a second dynamic range at least by transforming, at multiple modules stored in a plurality of memory units of the computing system and coupled to one or more processing units of the computing system in accordance with semiconductor manufacturing requirements pertaining to functions of the system, the system with at least the relationship in multiple stages into a transformed system that exhibits the second dynamic range, wherein the second dynamic range is less than the first dynamic range; and determine the behavior of the system by using at least the transformed system exhibiting the second dynamic range.

* * * * *